United States Patent
Wang (10) Patent No.: US 11,863,178 B2
(45) Date of Patent: Jan. 2, 2024

(54) METHOD FOR DETECTING RATIONALITY OF PG PIN POWER-ON TIME SEQUENCE, SYSTEM AND RELATED COMPONENTS

(71) Applicant: Inspur Suzhou Intelligent Technology Co., Ltd., Suzhou (CN)

(72) Inventor: Jian Wang, Suzhou (CN)

(73) Assignee: Inspur Suzhou Intelligent Technology Co., Ltd., Suzhou (CN)

( * ) Notice: Subject to any disclaimer, the term of this patent is extended or adjusted under 35 U.S.C. 154(b) by 75 days.

(21) Appl. No.: 17/764,334

(22) PCT Filed: Dec. 30, 2019

(86) PCT No.: PCT/CN2019/129971
§ 371 (c)(1),
(2) Date: Mar. 28, 2022

(87) PCT Pub. No.: WO2021/056908
PCT Pub. Date: Apr. 1, 2021

(65) Prior Publication Data
US 2022/0337246 A1 Oct. 20, 2022

(30) Foreign Application Priority Data
Sep. 29, 2019 (CN) .......................... 201910931266.0

(51) Int. Cl.
*G06F 1/26* (2006.01)
*H03K 19/017* (2006.01)
(Continued)

(52) U.S. Cl.
CPC ..... *H03K 19/01742* (2013.01); *H03K 17/223* (2013.01); *H03K 19/1774* (2013.01)

(58) Field of Classification Search
CPC .. G06F 1/26; H03K 17/223; H03K 19/01742; H03K 19/1774
See application file for complete search history.

(56) References Cited

U.S. PATENT DOCUMENTS

| | | | | |
|---|---|---|---|---|
| 10,644,692 | B2* | 5/2020 | Viviescas | H03K 17/22 |
| 2011/0316601 | A1* | 12/2011 | Chang | G06F 13/4077 |
| | | | | 327/161 |
| 2017/0336817 | A1* | 11/2017 | Randolph | H03F 3/4521 |

FOREIGN PATENT DOCUMENTS

| | | |
|---|---|---|
| CN | 202210758 U | 5/2012 |
| CN | 102522968 A | 6/2012 |

(Continued)

OTHER PUBLICATIONS

International Search Report dated Jun. 23, 2020 in reference to co-pending Chinese Application No. PCT/CN2019/129971 filed Dec. 30, 2019.

(Continued)

*Primary Examiner* — Kurtis R Bahr
(74) *Attorney, Agent, or Firm* — DINSMORE & SHOHL LLP (57) ABSTRACT

A method, system, and related component for detecting properness of a PG pin power-on timing sequence are provided. The method comprises: obtaining a pull-up level of a PG pin of a VR chip (S101); determining a value of a pull-up resistor of the PG pin, as a first resistance, when a current injected into the VR chip by using the pull-up level is equal to a maximum withstand current of the VR chip (S102); obtaining an equivalent resistance to ground when the PG pin is at a low level, and calculating, based on the equivalent resistance to ground, a value of the pull-up resistor of the PG pin, as a second resistance, when an output voltage of the PG pin is equal to a preset interference voltage limit value (S103); and outputting first prompt information when it is determined that an actual resistance of the pull-up resistor is lower than the first resistance or the second resistance (S104). The foregoing solution is applied, to determine whether a power-on timing sequence of PG pins (Continued)

in a VR chip is proper, thereby avoiding an incorrect action of a subsequent circuit.

6 Claims, 6 Drawing Sheets

(51) Int. Cl.
  *H03K 17/22* (2006.01)
  *H03K 19/17736* (2020.01)

(56) References Cited

FOREIGN PATENT DOCUMENTS

| | | |
|---|---|---|
| CN | 103700444 A | 4/2014 |
| CN | 104167967 A | 11/2014 |
| CN | 107168831 A | 9/2017 |
| CN | 107276394 A | 10/2017 |
| CN | 108964648 A | 12/2018 |
| CN | 109188242 A | 1/2019 |
| JP | 2012143110 A | 7/2012 |

OTHER PUBLICATIONS

Written Opinion dated Jun. 23, 2020 in reference to co-pending Chinese Application No. PCT/CN2019/129971 filed Dec. 30, 2019.

* cited by examiner

METHOD FOR DETECTING RATIONALITY OF PG PIN POWER-ON TIME SEQUENCE, SYSTEM AND RELATED COMPONENTS

CROSS-REFERENCE TO RELATED APPLICATIONS

The present application is a § 371 National Stage Application of International Application Serial No. PCT/CN2019/129971, filed Dec. 30, 2019, and claims the priority of Chinese patent application filed with the China Patent Office on Sep. 29, 2019, with the application number of 201910931266.0 and entitled "Method, System, and Related Component for Detecting Properness of PG Pin Power-on Timing Sequence," the contents of which are incorporated herein by reference in their entirety.

TECHNICAL FIELD

The present invention relates to the technical field of circuit technologies, in particular to a method, system, and related component for detecting properness of a PG pin power-on timing sequence.

BACKGROUND ART

Whether a power supply chip can safely and reliably supply power is critical to performance of a product. A correct power-on timing sequence is a prerequisite for a power supply to safely and reliably supply power.

A Power Good signal is a key signal in a voltage regulator (VR) chip. The signal has two main functions, where one is to feed back an operating status of a power supply to a related control chip, and the other is to be used as an Enable signal for another power supply chip, so that the power supply can be powered on according to a designed timing sequence. Therefore, a PG signal that is abnormal during a power-on process affects normal operation of a system.

Figure 1:
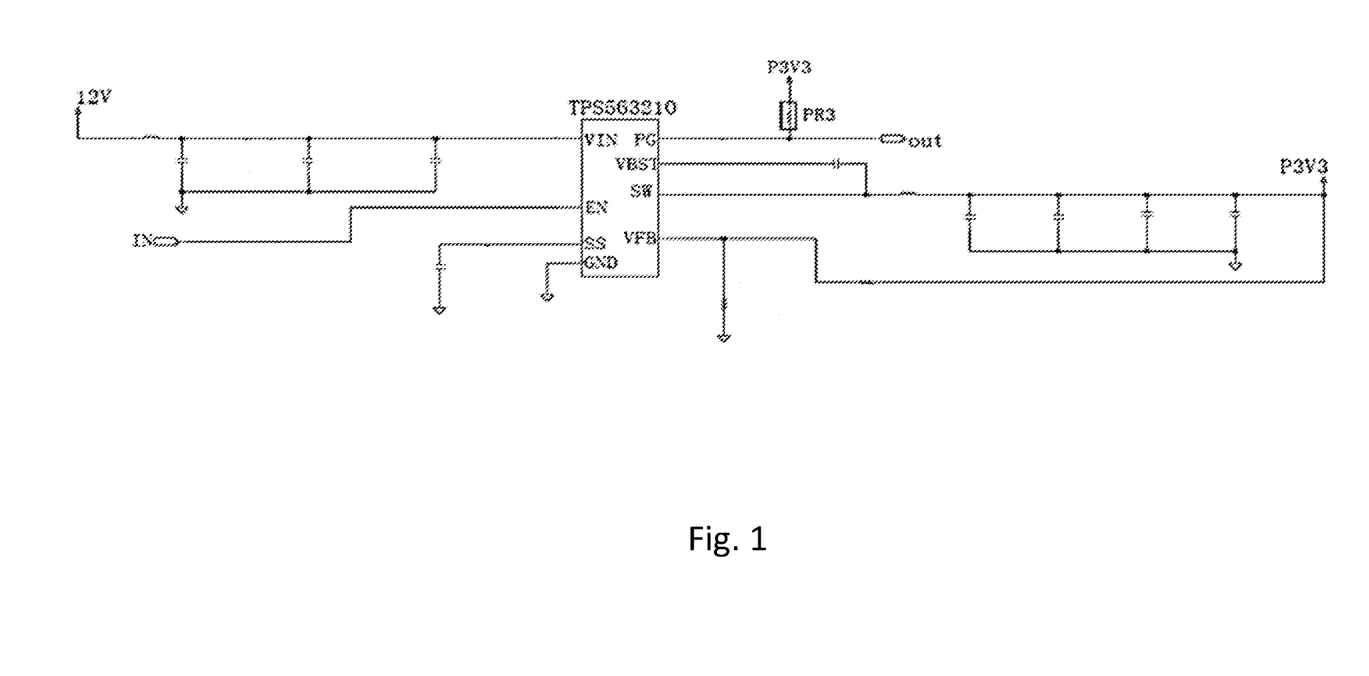
FIG. 1 is a schematic diagram of using a chip TPS563210 to convert a voltage of 12 V to a voltage of 3.3 V.

A pin of a PG signal of an existing VR chip is usually of an open-drain output type, and an external pull-up level is required to achieve output of a high-level signal. That is, the PG signal needs to be connected to a pull-up level through a pull-up resistor in the design. For example, FIG. 1 is a schematic diagram of using a chip TPS563210 to convert a voltage of 12 V to a voltage of 3.3 V. An output P3V3 is used as a pull-up level for a PG signal. A resistor with a resistance of 1 kΩ may usually be selected as a pull-up resistor PR3 with reference to a withstand current of a chip pin.

Figure 2:
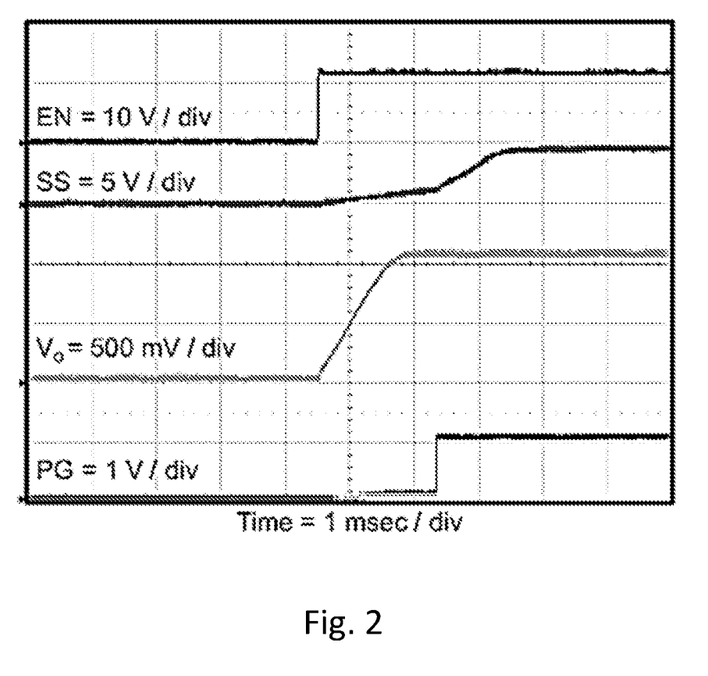
FIG. 2 is a schematic diagram of a power-on timing sequence shown in a chip datasheet in FIG. 1.

FIG. 2 shows a power-on timing sequence shown in a chip datasheet in FIG. 1. It can be learned from FIG. 2 that when an output voltage Vo rises to 90% of a normal operating voltage, a PG outputs a high-level signal after a delay of about 1 ms.

Figure 3:
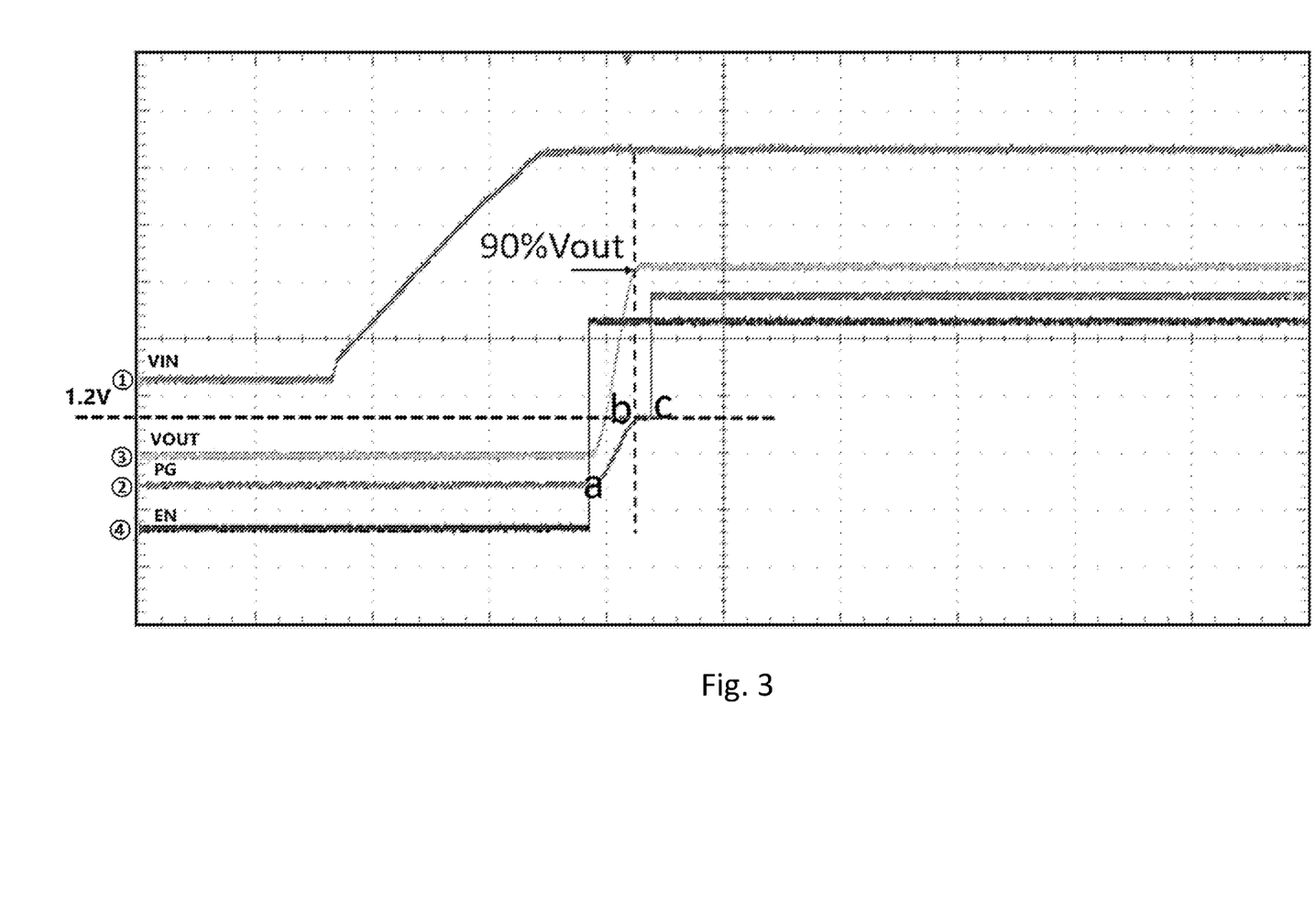
FIG. 3 is a schematic diagram of a timing waveform detected during actual application of a chip.

FIG. 3 shows a timing waveform detected during actual application. Normally, a PG signal should remain low before a point b, and then change to a high-level signal starting from a point c after about 1 ms when an output voltage is detected to reach a critical value of 90%. However, it can be learned from FIG. 3 that, actually, the PG signal rises starting from a point a, and has a voltage rise of about 1.2 V when reaching the point b. Since the PG signal needs to be used as an Enable signal for a subsequent circuit, 1.2 V may be higher than a critical value for Enable of a subsequent chip, which may cause the subsequent circuit to operate incorrectly, and consequently affect normal operation of a system.

In conclusion, how to effectively determine whether a power-on timing sequence of PG pins in a VR chip is proper, to avoid an incorrect action of a subsequent circuit, is currently a technical problem to be urgently resolved by those skilled in the art.

SUMMARY OF THE INVENTION

An objective of the present invention is to provide a method, system, and related component for detecting properness of a PG pin power-on timing sequence, to effectively determine whether a power-on timing sequence of PG pins in a VR chip is proper, to avoid an incorrect action of a subsequent circuit.

To resolve the technical problem, the present invention provides the following technical solutions:

A method for detecting properness of a PG pin power-on timing sequence includes:
obtaining a pull-up level of a PG pin of a VR chip;
determining a value of a pull-up resistor of the PG pin, as a first resistance, when a current injected into the VR chip by using the pull-up level is equal to a maximum withstand current of the VR chip;
obtaining an equivalent resistance to ground when the PG pin is at a low level, and calculating, based on the equivalent resistance to ground, a value of the pull-up resistor of the PG pin, as a second resistance, when an output voltage of the PG pin is equal to a preset interference voltage limit value; and
outputting, when it is determined that an actual resistance of the pull-up resistor is lower than the first resistance or the second resistance, first prompt information for indicating that a resistance of the pull-up resistor is improper and that the PG pin power-on timing sequence has a hidden danger.

Preferably, the method further includes:
obtaining a value of the pull-up resistor, as a third resistance, when an edge rate of the VR chip reaches a preset maximum edge rate;
obtaining a value of the pull-up resistor, as a fourth resistance, when an edge rate of the VR chip reaches a preset minimum edge rate; and
outputting second prompt information when it is determined that the actual resistance of the pull-up resistor is lower than the third resistance or higher than the fourth resistance.

Preferably, the method further includes:
obtaining a value of the pull-up resistor, as a fifth resistance, when a power loss of the pull-up resistor reaches a preset loss threshold; and
outputting third prompt information when it is determined that the actual resistance of the pull-up resistor is lower than the fifth resistance.

Preferably, the method further includes:
determining a resistance selection range by using the first resistance, the second resistance, the third resistance, the fourth resistance, and the fifth resistance and displaying the resistance selection range, where
for any value in the resistance selection range, the value is greater than or equal to the first resistance, is greater than or equal to the second resistance, is greater than or equal to the third resistance, is greater than or equal to the fifth resistance, and is less than or equal to the fourth resistance.

A system for detecting properness of a PG pin power-on timing sequence is provided, including:

a pull-up level obtaining module, configured to obtain a pull-up level of a PG pin of a VR chip;

a first resistance determining module, configured to determine a value of a pull-up resistor of the PG pin, as a first resistance, when a current injected into the VR chip by using the pull-up level is equal to a maximum withstand current of the VR chip;

a second resistance determining module, configured to: obtain an equivalent resistance to ground when the PG pin is at a low level, and calculate, based on the equivalent resistance to ground, a value of the pull-up resistor of the PG pin, as a second resistance, when an output voltage of the PG pin is equal to a preset interference voltage limit value; and a first prompt information output module, configured to output, when it is determined that an actual resistance of the pull-up resistor is lower than the first resistance or the second resistance, first prompt information for indicating that a resistance of the pull-up resistor is improper and that the PG pin power-on timing sequence has a hidden danger.

Preferably, the method further includes:

a third resistance determining module, configured to obtain a value of the pull-up resistor, as a third resistance, when an edge rate of the VR chip reaches a preset maximum edge rate;

a fourth resistance determining module, configured to obtain a value of the pull-up resistor, as a fourth resistance, when an edge rate of the VR chip reaches a preset minimum edge rate; and a second prompt information output module, configured to output second prompt information when it is determined that the actual resistance of the pull-up resistor is lower than the third resistance or higher than the fourth resistance.

Preferably, the method further includes:

a fifth resistance determining module, configured to obtain a value of the pull-up resistor, as a fifth resistance, when a power loss of the pull-up resistor reaches a preset loss threshold; and a third prompt information output module, configured to output third prompt information when it is determined that the actual resistance of the pull-up resistor is lower than the fifth resistance.

Preferably, the method further includes:

a resistance selection range display module, configured to: determine a resistance selection range by using the first resistance, the second resistance, the third resistance, the fourth resistance, and the fifth resistance and display the resistance selection range, where for any value in the resistance selection range, the value is greater than or equal to the first resistance, is greater than or equal to the second resistance, is greater than or equal to the third resistance, is greater than or equal to the fifth resistance, and is less than or equal to the fourth resistance.

A device for detecting properness of a PG pin power-on timing sequence is provided, including:

a memory, configured to store a computer program; and a processor, configured to execute the computer program to implement the step of the method for detecting properness of the PG pin power-on timing sequence according to any one of the foregoing aspects.

A computer-readable storage medium, the computer-readable storage medium stores a computer program, and the computer program implements the step of the method for detecting properness of the PG pin power-on timing sequence according to any one of the foregoing aspects when being executed by a processor.

The applicant analyzes a rising trend of a waveform of a PG signal, and considers that the rising trend of the waveform is basically consistent with a trend of a pull-up level P3V3. Therefore, it is considered that there is voltage division when the PG pin is at a low level, that is, there is an equivalent resistance to ground when the PG signal is at the low level. When the equivalent resistance to ground is relatively large, or a resistance of the pull-up resistor is relatively low, due to voltage division of the equivalent resistance to ground to the pull-up level, when the PG pin is at the low level, the output VOUT of the PG pin may be relatively high, which in turn may disrupt a correct power-on timing sequence and cause an incorrect action of the subsequent circuit. Therefore, when the resistance of the pull-up resistor is specified and selected, it should be considered whether the resistance of the pull-up resistor is excessively low, thus causing improperness of the PG pin power-on timing sequence.

Specifically, in this application, the value of the pull-up resistor of the PG pin when the current injected into the VR chip by using the pull-up level is equal to the maximum withstand current of the VR chip is determined, as the first resistance. The first resistance represents a minimum value of the pull-up resistor when it is ensured that the current injected into the VR chip by using the pull-up level is less than or equal to the maximum withstand current of the VR chip. In addition, in this application, the equivalent resistance to ground when the PG pin is at the low level is obtained, and the value of the pull-up resistor of the PG pin when the output voltage of the PG pin is equal to the preset interference voltage limit value is calculated based on the equivalent resistance to ground, as the second resistance. The second resistance represents a minimum value of the pull-up resistor when the incorrect action of the subsequent circuit is avoided. Therefore, the first prompt information is output when it is determined that the actual resistance of the pull-up resistor is lower than the first resistance or the second resistance. Therefore, according to the solutions of this application, it can be effectively determined whether a power-on timing sequence of PG pins in a VR chip is proper, to avoid an incorrect action of a subsequent circuit.

BRIEF DESCRIPTION OF THE DRAWINGS

In order to more clearly illustrate the technical solutions in the embodiments of the present application or the prior art, the accompanying drawings to be used in the description of the embodiments or the prior art will be briefly introduced. Apparently, the accompanying drawings in the following description are merely some embodiments of the present invention, and other accompanying drawings can be obtained from the provided accompanying drawings without any creative effort by those skilled in the art.

DETAILED DESCRIPTION OF THE EMBODIMENTS

A core of the present invention is to provide a method for detecting properness of a PG pin power-on timing sequence, to effectively determine whether a power-on timing sequence of PG pins in a VR chip is proper, to avoid an incorrect action of a subsequent circuit.

To make those skilled in the art better understand the solution of the present invention, the present invention will be further described in detail below with reference to the accompanying drawings and specific implementations. Apparently, the described embodiments are merely a part but not all of the embodiments of the present invention. Based on the embodiments in the present invention, all the other embodiments obtained by those of ordinary skill in the art without any creative effort shall all fall within the protection scope of the present invention.

In view of an abnormal power-on timing sequence of PG pins in a VR chip, the applicant firstly verifies whether the abnormality is caused by external interference. Specifically, circuit board line cut processing is adopted, that is, a connection between a PG signal and a subsequent circuit is disconnected. However, after a test, the abnormality still exists. In this case, impact of the external interference may be excluded, and then it may be determined that the problem lies in a voltage conversion circuit itself.

The applicant further analyzes a rising trend of a waveform of the PG signal, and considers that the rising trend of the waveform is basically consistent with a trend of a pull-up level P3V3. It should be noted that, although FIG. 3 does not show a rising trend of a waveform of the pull-up level P3V3, the rising trend of the waveform of the pull-up level P3V3 is basically the same as a rising trend of a waveform of VOUT. Therefore, the applicant considers that there is voltage division when a PG pin is at a low level. That is, there is an equivalent resistance to ground when the PG signal is at the low level. When the equivalent resistance to ground is relatively large, or a resistance of a pull-up resistor is relatively low, due to voltage division of the equivalent resistance to ground to the pull-up level, when the PG pin is at the low level, the output VOUT of the PG pin may be relatively high, for example, reach 1.2 V as shown in FIG. 3, which in turn may disrupt a correct power-on timing sequence and cause an incorrect action of the subsequent circuit.

Figure 4:
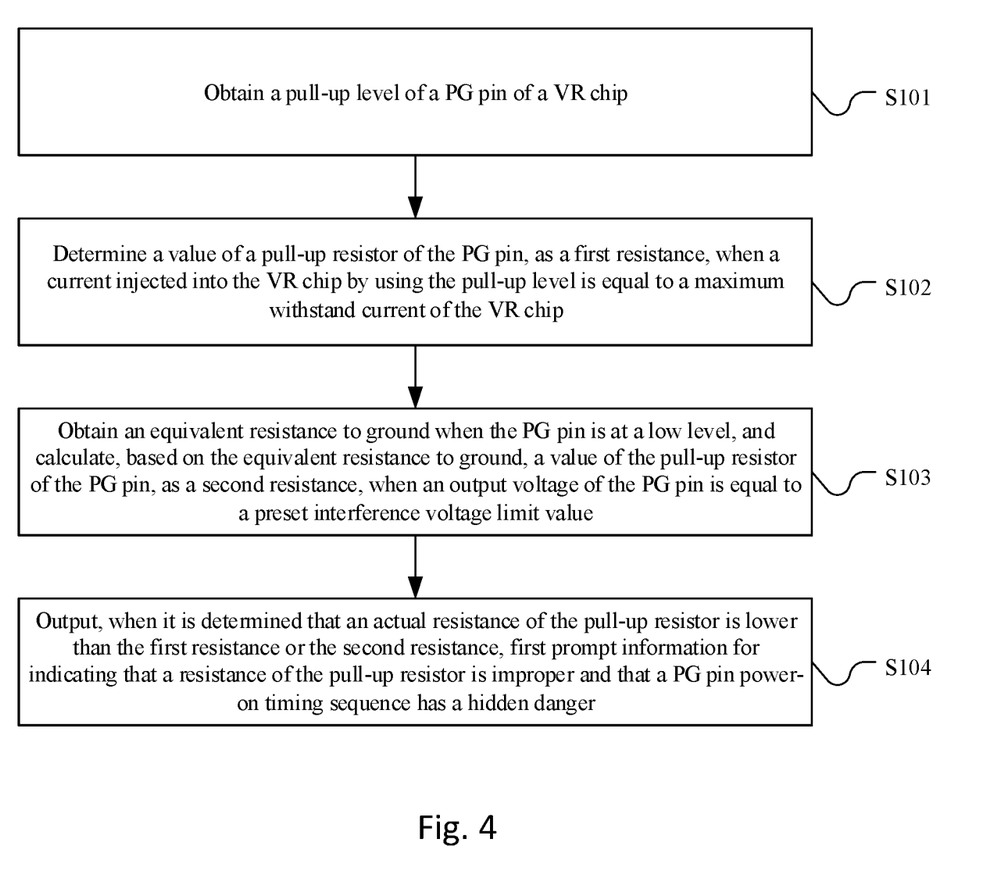
FIG. 4 is a flowchart of implementation of a method for detecting properness of a PG pin power-on timing sequence according to the present invention.

Referring to FIG. 4, FIG. 4 is a flowchart of implementation of a method for detecting properness of a PG pin power-on timing sequence according to the present invention, and may include the following steps:

Step S101: Obtain a pull-up level of a PG pin of a VR chip.

Different pull-up levels may be adopted for different VR chips. Usually, the pull-up level of the PG pin may be obtained by reading a parameter list of the VR chip, and certainly, the pull-up level may alternatively be input by a relevant staff through an input device, so that a system for detecting properness of the PG pin power-on timing sequence may obtain the pull-up level of the PG pin.

Step S102: Determine a value of a pull-up resistor of the PG pin, as a first resistance, when a current injected into the VR chip by using the pull-up level is equal to a maximum withstand current of the VR chip.

It may be understood that the value of the pull-up resistor affects the current injected into the VR chip, and a larger value of the pull-up resistor indicates a lower injected current, and on the contrary, a lower value of the pull-up resistor indicates a higher injected current. For a specific VR chip, the VR chip has a specified maximum withstand current. Therefore, a pull-up resistance, that is, the value of the pull-up resistor, cannot be specified excessively low. It is necessary to ensure that the current injected into the VR chip by using the pull-up level is less than or equal to the maximum withstand current of the VR chip. A minimum value of the pull-up resistor that satisfies this indicator is the first resistance described in this application.

For example, when the pull-up level is 3.3 V, if the resistance of the pull-up resistor is 400Ω, the current injected into the VR chip in this case is equal to the maximum withstand current of the VR chip. In this case, 400Ω is the first resistance described in this application. When subsequent selection and adjustment of the resistance of the pull-up resistor are performed, the resistance needs to be set to at least 400 ohms.

It should be additionally noted that, since a value range of the pull-up resistor is usually defined by considering the maximum withstand current of the VR chip in a conventional solution, step S102 may refer to the relevant prior art to calculate a critical value, namely, the first resistance, that is of the pull-up resistor and that satisfies a withstand current indicator.

Step S103: Obtain an equivalent resistance to ground when the PG pin is at a low level, and calculate, based on the equivalent resistance to ground, a value of the pull-up resistor of the PG pin, as a second resistance, when an output voltage of the PG pin is equal to a preset interference voltage limit value.

The equivalent resistance to ground may be obtained in a plurality of manners. For example, data in a VR chip parameter table may be obtained. For example, it is obtained that when PG=0.5 V, a sink current of the PG pin ranges from 0.5 mA to 1 mA. In this case, it may be determined that a range of the equivalent resistance to ground when the PG pin is at the low level ranges from 500Ω to 1000Ω, and then, for example, an intermediate value of 750 ohms may be obtained as the obtained equivalent resistance to ground. For another example, it is considered that an error occurs in the PG pin power-on timing sequence due to voltage division of the equivalent resistance to ground. In this case, a maximum value of 1000 ohms may be obtained as the equivalent resistance to ground, so that a subsequently calculated divided voltage of the equivalent resistance to ground is not lower than an actual divided voltage thereof.

For another example, in another implementation, an actual power-on timing sequence of the VR chip may be obtained, and further the equivalent resistance to ground when the PG pin is at the low level is determined. Specifically, for example, in the embodiment in FIG. 3, the pull-up level of the VR chip is 3.3 V, a divided voltage when the PG pin is at the low level is 1.2 V, and an actual resistance of the pull-up resistor is 1000Ω. In this case, the equivalent resistance to ground when the PG pin is at the low level=1000*1.2/(3.3−1.2)=572Ω. That is, the equivalent resistance to ground when the PG pin is at the low level/the pull-up resistance=an output voltage when the PG pin is at the low level/(the pull-up level−the output voltage when the PG pin is at the low level).

After the equivalent resistance to ground when the PG pin is at the low level is obtained, the value of the pull-up resistor of the PG pin when the output voltage of the PG pin is equal to a preset interference voltage limit value may be calculated based on the equivalent resistance to ground, and the value is denoted as the second resistance in this application.

The interference voltage limit value refers to a maximum voltage value allowed to be output by the PG pin when the PG pin is at the low level, for example, is usually 200 mV. In other words, when the PG pin is at the low level, the output voltage is lower than 200 mV. This does not cause an incorrect action of a subsequent circuit. Certainly, another specific value may be used for the interference voltage limit value in another implementation.

An example in which the equivalent resistance to ground is 572Ω and the pull-up level is 3.3 V is still used. When the interference voltage limit value is 200 mV, 572/the value of the pull-up resistor=0.2/3.3. That is, in the specific embodiment, the value of the pull-up resistor=572*3.3/0.2=9438Ω. That is, the second resistance is 9438Ω. This represents that a voltage of an output terminal of the PG pin when the PG pin is at the low level is lower than the interference voltage limit value of 200 mV only when the value of the pull-up resistor is greater than or equal to 9438Ω, to avoid an incorrect action of the subsequent circuit.

It should be additionally noted that, when the PG pin is at the low level, the VR chip usually controls a related switch circuit in the inside of the chip to be turned on, that is, to enable the PG pin to be grounded. In addition, the grounded PG pin has a relatively large equivalent resistance. This is because, usually, during actual application, the switch circuit does not necessarily consist of a single switch tube, for example, a single MOS, and a related circuit may function as a switch, resulting in a relatively large equivalent resistance to ground when the PG pin is at the low level. Certainly, in another specific occasion, due to another type of reason, there may still be a relatively large equivalent resistance to ground when the PG pin is grounded. The relatively large equivalent resistance to ground makes it possible to cause an incorrect action of the subsequent circuit when the PG pin is at the low level. This is the reason why the PG pin power-on timing sequence described in this application is improper.

Step S104: Output, when it is determined that an actual resistance of the pull-up resistor is lower than the first resistance or the second resistance, first prompt information for indicating that a resistance of the pull-up resistor is improper and that the PG pin power-on timing sequence has a hidden danger.

When it is determined that the actual resistance of the pull-up resistor is lower than the first resistance, it indicates that the current flowing into the VR chip by using the pull-up level may exceed a withstand current of the VR chip. When the actual resistance of the pull-up resistor is lower than the second resistance, an incorrect action of the subsequent circuit may also be caused when the PG pin is at the low level. In other words, the actual resistance of the pull-up resistor being higher than the first resistance and higher than the second resistance is a proper resistance of the pull-up resistor, so that the first prompt information is not output.

Certainly, whether the current of the VR chip exceeds the withstand current of the VR chip, or the incorrect action of the subsequent circuit is caused when the PG pin is at the low level, it can be determined that the PG pin power-on timing sequence has a hidden danger. Therefore, the first prompt information is used to represent that the resistance of the pull-up resistor is improper and that the PG pin power-on timing sequence has a hidden danger, to provide a prompt for indicating a relevant staff to notice this case, so that the resistance of the pull-up resistor can be adjusted in time. Certainly, the adjustment described herein may be adjustment performed in a circuit design stage, or may be adjustment of an actually produced hardware circuit, but is usually adjustment performed in the design stage.

The applicant analyzes a rising trend of a waveform of a PG signal, and considers that the rising trend of the waveform is basically consistent with a trend of a pull-up level P3V3. Therefore, it is considered that there is voltage division when the PG pin is at a low level, that is, there is an equivalent resistance to ground when the PG signal is at the low level. When the equivalent resistance to ground is relatively large, or a resistance of the pull-up resistor is relatively low, due to voltage division of the equivalent resistance to ground to the pull-up level, when the PG pin is at the low level, the output VOUT of the PG pin may be relatively high, which in turn may disrupt a correct power-on timing sequence and cause an incorrect action of the subsequent circuit. Therefore, when the resistance of the pull-up resistor is specified and selected, it should be considered whether the resistance of the pull-up resistor is excessively low, thus causing improperness of the PG pin power-on timing sequence.

Specifically, in this application, the value of the pull-up resistor of the PG pin when the current injected into the VR chip by using the pull-up level is equal to the maximum withstand current of the VR chip is determined, as the first resistance. The first resistance represents a minimum value of the pull-up resistor when it is ensured that the current injected into the VR chip by using the pull-up level is less than or equal to the maximum withstand current of the VR chip. In addition, in this application, the equivalent resistance to ground when the PG pin is at the low level is obtained, and the value of the pull-up resistor of the PG pin when the output voltage of the PG pin is equal to the preset interference voltage limit value is calculated based on the equivalent resistance to ground, as the second resistance. The second resistance represents a minimum value of the pull-up resistor when the incorrect action of the subsequent circuit is avoided. Therefore, the first prompt information is output when it is determined that the actual resistance of the pull-up resistor is lower than the first resistance or the second resistance. Therefore, according to the solutions of this application, it can be effectively determined whether a power-on timing sequence of PG pins in a VR chip is proper, to avoid an incorrect action of a subsequent circuit.

In a specific implementation of the present invention, the method may further include:
  obtaining a value of the pull-up resistor, as a third resistance, when an edge rate of the VR chip reaches a preset maximum edge rate;
  obtaining a value of the pull-up resistor, as a fourth resistance, when an edge rate of the VR chip reaches a preset minimum edge rate; and
  outputting second prompt information when it is determined that the actual resistance of the pull-up resistor is lower than the third resistance or higher than the fourth resistance.

In the foregoing implementation, two indicators are considered for the resistance of the pull-up resistor. One is to ensure that the current flowing into the VR chip is within a withstand range of the VR chip, and the other is to avoid the incorrect action of the subsequent circuit because of overvoltage caused when the PG pin is at the low level. In this implementation, it is further considered that the resistance of the pull-up resistor affects an edge rate of a signal.

Specifically, a higher resistance of the pull-up resistor indicates a lower edge rate of the signal. Correspondingly, a lower resistance of the pull-up resistor indicates a higher edge rate of the signal. In addition, a maximum edge rate and a minimum edge rate are usually preset for the VR chip. Therefore, the third resistance and the fourth resistance are calculated in this implementation of this application. That is, when the actual resistance of the pull-up resistor is greater than or equal to the third resistance and is less than or equal to the fourth resistance, it indicates that this edge rate indicator is satisfied. Correspondingly, when it is determined that the actual resistance of the pull-up resistor is lower than the third resistance or higher than the fourth resistance, the second prompt information may be output, to provide a prompt for indicating a relevant staff to notice this case, so that the resistance of the pull-up resistor can be adjusted in time.

In a specific implementation of the present invention, the method further includes:
  obtaining a value of the pull-up resistor, as a fifth resistance, when a power loss of the pull-up resistor reaches a preset loss threshold; and
  outputting third prompt information when it is determined that the actual resistance of the pull-up resistor is lower than the fifth resistance.

In addition to the three indicators described in the foregoing embodiment, the power loss of the pull-up resistor is also considered in this implementation. Specifically, a lower resistance of the pull-up resistor indicates a higher power loss of the pull-up resistor. When it is determined that the actual resistance of the pull-up resistor is lower than the fifth resistance, it indicates that a power loss of the pull-up resistor is higher than a loss threshold, and therefore the third prompt information is output, to provide a prompt for indicating a relevant staff to notice a case in which the power loss is excessively high.

Further, in a specific implementation, the method may further include:
  determining a resistance selection range by using the first resistance, the second resistance, the third resistance, the fourth resistance, and the fifth resistance and displaying the resistance selection range, where
  for any value in the resistance selection range, the value is greater than or equal to the first resistance, is greater than or equal to the second resistance, is greater than or equal to the third resistance, is greater than or equal to the fifth resistance, and is less than or equal to the fourth resistance.

Figure 5:
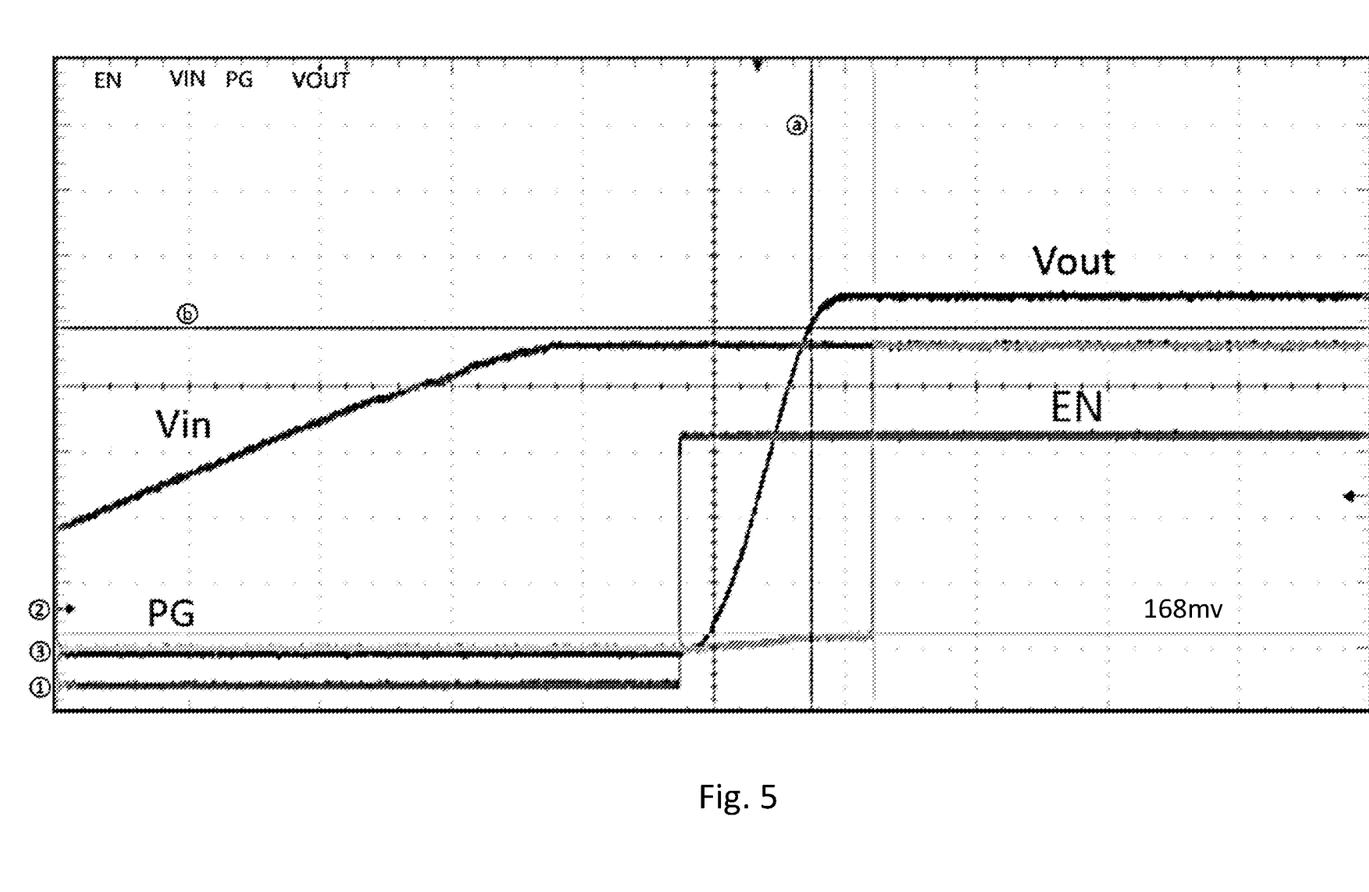
FIG. 5 is a schematic diagram of a timing waveform after a resistance of a pull-up resistor is adjusted according to a specific implementation of the present invention.

In other words, in this implementation, a resistance selection range that satisfies the four indicators described in the foregoing embodiment is determined, and the pull-up resistance may be selected from the resistance selection range according to an actual need. In addition, in this application, the resistance selection range is displayed, to help a relevant staff intuitively see the range and further specify and adjust the resistance of the pull-up resistor. For example, in the implementation in FIG. 1, the resistance of the pull-up resistor is adjusted from 1000 ohms to 10000 ohms. For a timing waveform after the adjustment, refer to FIG. 5. It can be learned that a step of the PG signal changes to 168 mV. When the output voltage reaches a critical value of 90%, after about 1 ms, the PG signal rises starting from 168 mV. This meets a requirement of the PG pin power-on timing sequence.

It should be additionally noted that, the resistance selection range that satisfies the four indicators can usually be determined. In rare occasions, it may not be possible to simultaneously satisfy the four indicators. In this case, prompt information may also be output, so that the staff can weigh importance of each indicator to select a preferred resistance of the pull-up resistor. For example, it should be preferentially ensured that the value of the pull-up resistor needs to be greater than or equal to the first resistance and greater than the second resistance. Second, it is considered that the value is greater than or equal to the third resistance and is less than or equal to the fourth resistance. Finally, a condition that the value is greater than or equal to the fifth resistance is considered to be met.

Corresponding to the foregoing method embodiments, an embodiment of the present invention further provides a system for detecting properness of a PG pin power-on timing sequence, which can be cross-referenced with the above.

Figure 6:
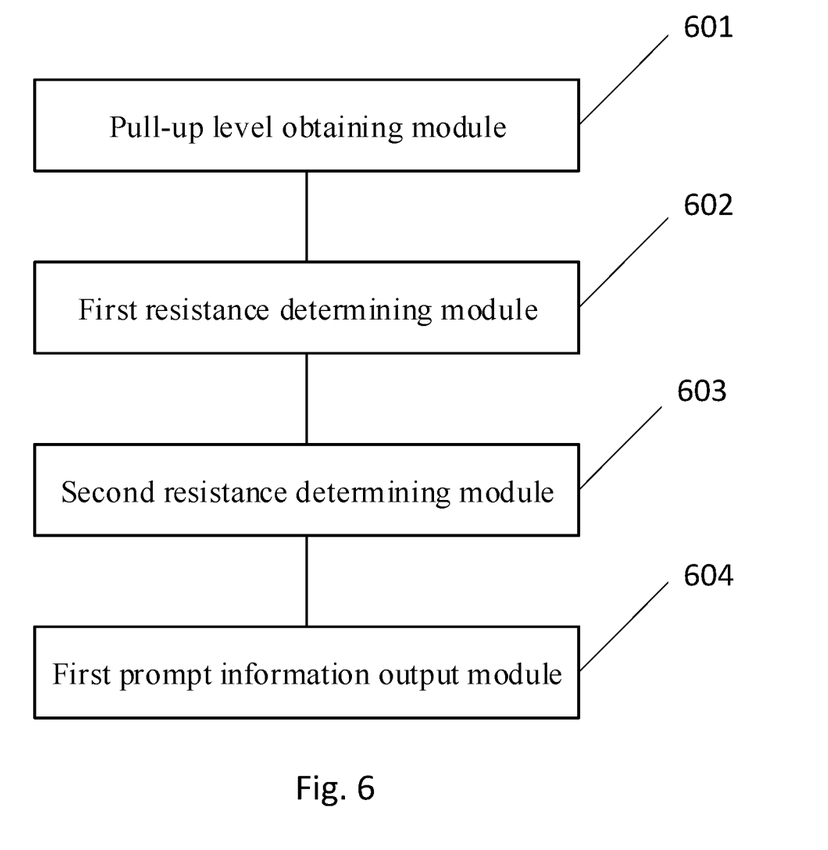
FIG. 6 is a schematic structural diagram of a system for detecting properness of a PG pin power-on timing sequence according to the present invention.

FIG. 6 is a schematic structural diagram of a system for detecting properness of a PG pin power-on timing sequence according to the present invention, including:
  a pull-up level obtaining module 601, configured to obtain a pull-up level of a PG pin of a VR chip;
  a first resistance determining module 602, configured to determine a value of a pull-up resistor of the PG pin, as a first resistance, when a current injected into the VR chip by using the pull-up level is equal to a maximum withstand current of the VR chip;
  a second resistance determining module 603, configured to: obtain an equivalent resistance to ground when the PG pin is at a low level, and calculate, based on the equivalent resistance to ground, a value of the pull-up resistor of the PG pin, as a second resistance, when an output voltage of the PG pin is equal to a preset interference voltage limit value; and
  a first prompt information output module 604, configured to output, when it is determined that an actual resistance of the pull-up resistor is lower than the first resistance or the second resistance, first prompt information for indicating that a resistance of the pull-up resistor is improper and that the PG pin power-on timing sequence has a hidden danger.

In a specific implementation of the present invention, the method further includes:
  a third resistance determining module, configured to obtain a value of the pull-up resistor, as a third resistance, when an edge rate of the VR chip reaches a preset maximum edge rate;
  a fourth resistance determining module, configured to obtain a value of the pull-up resistor, as a fourth resistance, when an edge rate of the VR chip reaches a preset minimum edge rate; and
  a second prompt information output module, configured to output second prompt information when it is determined that the actual resistance of the pull-up resistor is lower than the third resistance or higher than the fourth resistance.

In a specific implementation of the present invention, the method further includes:
  a fifth resistance determining module, configured to obtain a value of the pull-up resistor, as a fifth resistance, when a power loss of the pull-up resistor reaches a preset loss threshold; and a third prompt information output module, configured to output third prompt information when it is determined that the actual resistance of the pull-up resistor is lower than the fifth resistance.

In a specific implementation of the present invention, the method further includes:

a resistance selection range display module, configured to: determine a resistance selection range by using the first resistance, the second resistance, the third resistance, the fourth resistance, and the fifth resistance and display the resistance selection range, where for any value in the resistance selection range, the value is greater than or equal to the first resistance, is greater than or equal to the second resistance, is greater than or equal to the third resistance, is greater than or equal to the fifth resistance, and is less than or equal to the fourth resistance.

Corresponding to the foregoing method and system embodiments, an embodiment of the present invention further provides a device for detecting properness of a PG pin power-on timing sequence and a computer-readable storage medium, which can be cross-referenced with the above.

Figure 7:
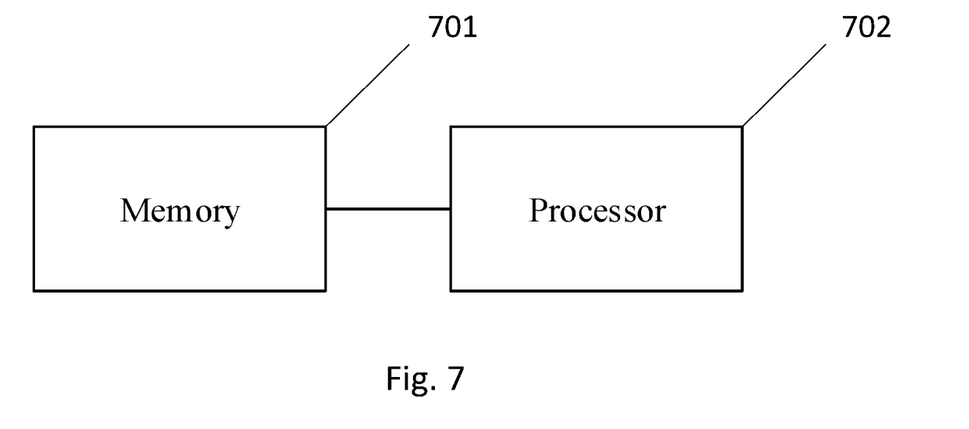
FIG. 7 is a schematic structural diagram of a device for detecting properness of a PG pin power-on timing sequence according to the present invention.

FIG. 7 is a schematic structural diagram of a device for detecting properness of a PG pin power-on timing sequence, including:

a memory 701, configured to store a computer program; and a processor 702, configured to execute the computer program to implement the step of the method for detecting properness of the PG pin power-on timing sequence according to any one of the foregoing embodiments.

A computer-readable storage medium storing a computer program is provided. The computer program implements the step of the method for detecting properness of a PG pin power-on timing sequence according to any one of the foregoing embodiments when being executed by a processor. The computer-readable storage medium mentioned herein includes a random access memory (RAM), an internal memory, a read-only memory (ROM), an electrically programmable ROM, an electrically erasable programmable ROM, a register, a hard disk, a removable disk, a CD-ROM, or any other form of storage medium known in the technical field.

The professionals may further realize that the units and algorithmic steps of each example described in combination with the embodiments disclosed herein are capable of being implemented in electronic hardware, computer software, or a combination of the two, and the composition and steps of each example have been described generally by function in the above description for the purpose of clearly illustrating the interchangeability of hardware and software. Whether these functions are performed in hardware or software depends on the particular application and design constraints of the technical solution. Those skilled in the art may use different methods to implement the described functions for each particular application, but such implementation should not be considered as going beyond the scope of the present invention.

Specific examples have been applied herein to illustrate the principles and implementation of the present invention, and the above descriptions of the embodiments are merely used to help understand the technical solution of the present invention and its core ideas. It should be noted that, for those skilled in the art, several improvements and modifications can be made to the present invention without departing from the principles of the present invention, and such improvements and modifications shall also fall within the protection scope of the claims of the present invention.

The invention claimed is:

1. A method for detecting properness of a Power-Good pin (PG pin) power-on timing sequence, comprising:

obtaining a pull-up level of a PG pin of a Voltage Regulator chip (VR chip);

determining a value of a pull-up resistor of the PG pin, as a first resistance, when a current injected into the VR chip by using the pull-up level is equal to a maximum withstand current of the VR chip;

obtaining an equivalent resistance to ground when the PG pin is at a low level, and calculating, based on the equivalent resistance to ground, a value of the pull-up resistor of the PG pin, as a second resistance, when an output voltage of the PG pin is equal to a preset interference voltage limit value; and outputting, when it is determined that an actual resistance of the pull-up resistor is lower than the first resistance or the second resistance, first prompt information for indicating that a resistance of the pull-up resistor is improper and that the PG pin power-on timing sequence has a hidden danger.

2. The method for detecting properness of the PG pin power-on timing sequence according to claim 1, further comprising:

obtaining a value of the pull-up resistor, as a third resistance, when an edge rate of the VR chip reaches a preset maximum edge rate;

obtaining a value of the pull-up resistor, as a fourth resistance, when an edge rate of the VR chip reaches a preset minimum edge rate; and outputting second prompt information when it is determined that the actual resistance of the pull-up resistor is lower than the third resistance or higher than the fourth resistance.

3. The method for detecting properness of the PG pin power-on timing sequence according to claim 2, further comprising:

obtaining a value of the pull-up resistor, as a fifth resistance, when a power loss of the pull-up resistor reaches a preset loss threshold; and outputting third prompt information when it is determined that the actual resistance of the pull-up resistor is lower than the fifth resistance.

4. The method for detecting properness of the PG pin power-on timing sequence according to claim 3, further comprising:

determining a resistance selection range by using the first resistance, the second resistance, the third resistance, the fourth resistance, and the fifth resistance and displaying the resistance selection range, wherein for any value in the resistance selection range, the value is greater than or equal to the first resistance, is greater than or equal to the second resistance, is greater than or equal to the third resistance, is greater than or equal to the fifth resistance, and is less than or equal to the fourth resistance.

5. A device for detecting properness of a Power-Good pin (PG pin) power-on timing sequence, comprising:

a memory, configured to store a computer program; and a processor, configured to execute the computer program to implement the step of the method for detecting properness of the PG pin power-on timing sequence according to claim 1.

6. A computer-readable storage medium, the computer-readable storage medium stores a computer program, and the computer program implements the step of the method for detecting properness of a Power-Good pin (PG pin) power-on timing sequence according to claim 1 when being executed by a processor.

\* \* \* \* \*